(12) United States Patent
Maekawa et al.

(10) Patent No.: US 9,978,891 B2
(45) Date of Patent: May 22, 2018

(54) SOLAR CELL MODULE

(71) Applicant: Panasonic Intellectual Property Management Co., Ltd., Osaka (JP)

(72) Inventors: Akimichi Maekawa, Osaka (JP); Tasuku Ishiguro, Osaka (JP); Yukako Sakuragi, Tokyo (JP); Atsushi Saita, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days. days.

(21) Appl. No.: 15/468,122

(22) Filed: Mar. 24, 2017

(65) Prior Publication Data

US 2017/0207353 A1 Jul. 20, 2017

Related U.S. Application Data

(63) Continuation of application No. PCT/JP2015/004495, filed on Sep. 4, 2015.

(30) Foreign Application Priority Data

Sep. 26, 2014 (JP) .................................. 2014-196527

(51) Int. Cl.
*H01L 31/0232* (2014.01)
*H01L 31/0216* (2014.01)
*H01L 31/048* (2014.01)

(52) U.S. Cl.
CPC .. *H01L 31/02327* (2013.01); *H01L 31/02167* (2013.01); *H01L 31/048* (2013.01)

(58) Field of Classification Search
CPC ........... H01L 31/0232; H01L 31/02167; H01L 31/048
See application file for complete search history.

(56) References Cited

U.S. PATENT DOCUMENTS 5,296,043 A * 3/1994 Kawakami ...... H01L 31/022425
136/244
5,480,494 A * 1/1996 Inoue .................... F24J 2/5205
136/244

(Continued)

FOREIGN PATENT DOCUMENTS

| JP | S60-250946 A | 12/1985 |
|----|----|----|
| JP | 2006-36874 A | 2/2006 |
| WO | 2013/146516 A1 | 10/2013 |

OTHER PUBLICATIONS

International Search Report (ISR) dated Nov. 24, 2015 for PCT Application No. PCT/JP2015/004495.

*Primary Examiner* — Golam Mowla
(74) *Attorney, Agent, or Firm* — Metrolexis Law Group, PLLC

(57) ABSTRACT

A solar cell module includes: solar cells each having a first main surface and a second main surface; a front-side transparent protective member disposed on a first main surface-side of the solar cells; a front-side transparent encapsulant layer disposed between the front-side transparent protective member and the solar cells; a back-side protective member disposed on a second main surface-side of the solar cells; a back-side white encapsulant layer disposed between the back-side protective member and the solar cells; and a back-side transparent encapsulant layer disposed between the back-side white encapsulant layer and the solar cells, wherein a thickness of the back-side transparent encapsulant layer in a vicinity of an edge portion of the second main surface of the solar cells is less than a thickness of the back-side transparent encapsulant layer in a region between the solar cells that are neighboring to each other.

2 Claims, 4 Drawing Sheets

(56) References Cited

U.S. PATENT DOCUMENTS

| | | | | |
|---|---|---|---|---|
| 5,582,653 | A | * | 12/1996 | Kataoka .......... H01L 31/022425 136/251 |
| 2004/0161593 | A1 | * | 8/2004 | Yamazaki ............... H05K 1/162 428/209 |
| 2004/0200522 | A1 | * | 10/2004 | Fukawa .......... H01L 31/022425 136/259 |
| 2005/0115602 | A1 | * | 6/2005 | Senta .............. H01L 31/035281 136/250 |
| 2006/0231134 | A1 | * | 10/2006 | Yagiura ................. H01L 31/048 136/251 |
| 2006/0272844 | A1 | * | 12/2006 | Berghofer ........... H01L 31/0508 174/94 R |
| 2007/0062573 | A1 | * | 3/2007 | Ferri ................. B32B 17/10036 136/251 |
| 2007/0235077 | A1 | * | 10/2007 | Nagata ............. B32B 17/10018 136/256 |
| 2008/0053512 | A1 | * | 3/2008 | Kawashima ...... B32B 17/10018 136/244 |
| 2008/0121266 | A1 | * | 5/2008 | Tsunomura ......... H01L 31/0747 136/244 |
| 2008/0196757 | A1 | * | 8/2008 | Yoshimine ...... H01L 31/022425 136/244 |
| 2009/0078314 | A1 | * | 3/2009 | Temchenko ...... B32B 17/10788 136/256 |
| 2009/0293934 | A1 | * | 12/2009 | Okada ............... H01L 31/02168 136/246 |
| 2010/0116314 | A1 | * | 5/2010 | Fukushima ................ C09J 9/02 136/244 |
| 2012/0285536 | A1 | * | 11/2012 | Ishiguro ............ B32B 17/10018 136/259 |
| 2015/0007886 | A1 | | 1/2015 | Takegami |

\* cited by examiner

SOLAR CELL MODULE

CROSS REFERENCE TO RELATED APPLICATIONS

This application is a U.S. continuation application of PCT International Patent Application Number PCT/JP2015/004495 filed on Sep. 4, 2015, claiming the benefit of priority of Japanese Patent Application Number 2014-196527 filed on Sep. 26, 2014, the entire contents of which are incorporated herein by reference.

BACKGROUND

1. Technical Field

The present disclosure relates to a solar cell module.

2. Description of the Related Art

In a solar cell module, solar cells are sealed in an encapsulant layer disposed between a light receiving-side protective member and a back-side protective member. For example, in Patent Literature (PTL) 1 (Japanese Unexamined Patent Application Publication No. 2006-36874), a white encapsulant layer to which a white pigment such as titanium oxide is added is disposed in a portion between solar cells and a back-side protective member. It has been proposed to improve output characteristics of a solar cell module by reflecting light that has passed between the solar cells off the white encapsulant layer to cause the light to enter the solar cells.

SUMMARY

The present disclosure provides a solar cell module that enables further improvement in the output characteristics.

A solar cell module according to a first aspect of the present disclosure includes: a plurality of solar cells each having a first main surface and a second main surface; a front-side transparent protective member disposed on a first main surface-side of the plurality of solar cells; a front-side transparent encapsulant layer disposed between the front-side transparent protective member and the plurality of solar cells; a back-side protective member disposed on a second main surface-side of the plurality of solar cells; a back-side white encapsulant layer disposed between the back-side protective member and the plurality of solar cells; and a back-side transparent encapsulant layer disposed between the back-side white encapsulant layer and the plurality of solar cells, wherein a thickness of the back-side transparent encapsulant layer in a vicinity of an edge portion of the second main surface of the plurality of solar cells is less than a thickness of the back-side transparent encapsulant layer in a region between the plurality of solar cells that are neighboring to each other.

A solar cell module according to a second aspect of the present disclosure includes: a plurality of solar cells each having a first main surface and a second main surface; a front-side transparent protective member disposed on a first main surface-side of the plurality of solar cells; a front-side transparent encapsulant layer disposed between the front-side transparent protective member and the plurality of solar cells; a back-side protective member disposed on a second main surface-side of the plurality of solar cells; a back-side white encapsulant layer disposed between the back-side protective member and the plurality of solar cells; and a back-side transparent encapsulant layer disposed between the back-side white encapsulant layer and the plurality of solar cells, wherein a thickness of the back-side transparent encapsulant layer in a vicinity of an edge portion of the second main surface of the plurality of solar cells is less than a thickness of the back-side transparent encapsulant layer in a region interposed between the second main surface of the plurality of solar cells and the back-side white encapsulant layer.

The solar cell module according to the present disclosure enables further improvement in the output characteristics.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

The following describes in detail a solar cell module according to embodiments of the present disclosure with reference to the drawings. Embodiments of the present disclosure are described below. However, the embodiments below are merely illustrative, and the present disclosure is not limited to the embodiments below. Therefore, shapes, materials, structural components, the arrangement and connection of the structural components, etc. shown in the following embodiments are mere examples, and are not intended to limit the scope of the present disclosure. Moreover, among the structural components in the embodiments below, structural components not recited in any one of independent claims which indicate the broadest concepts of the present disclosure are described as arbitrary structural components.

In addition, in the respective diagrams, structural components having substantially identical functions may be given the same reference signs.

Figure 1:
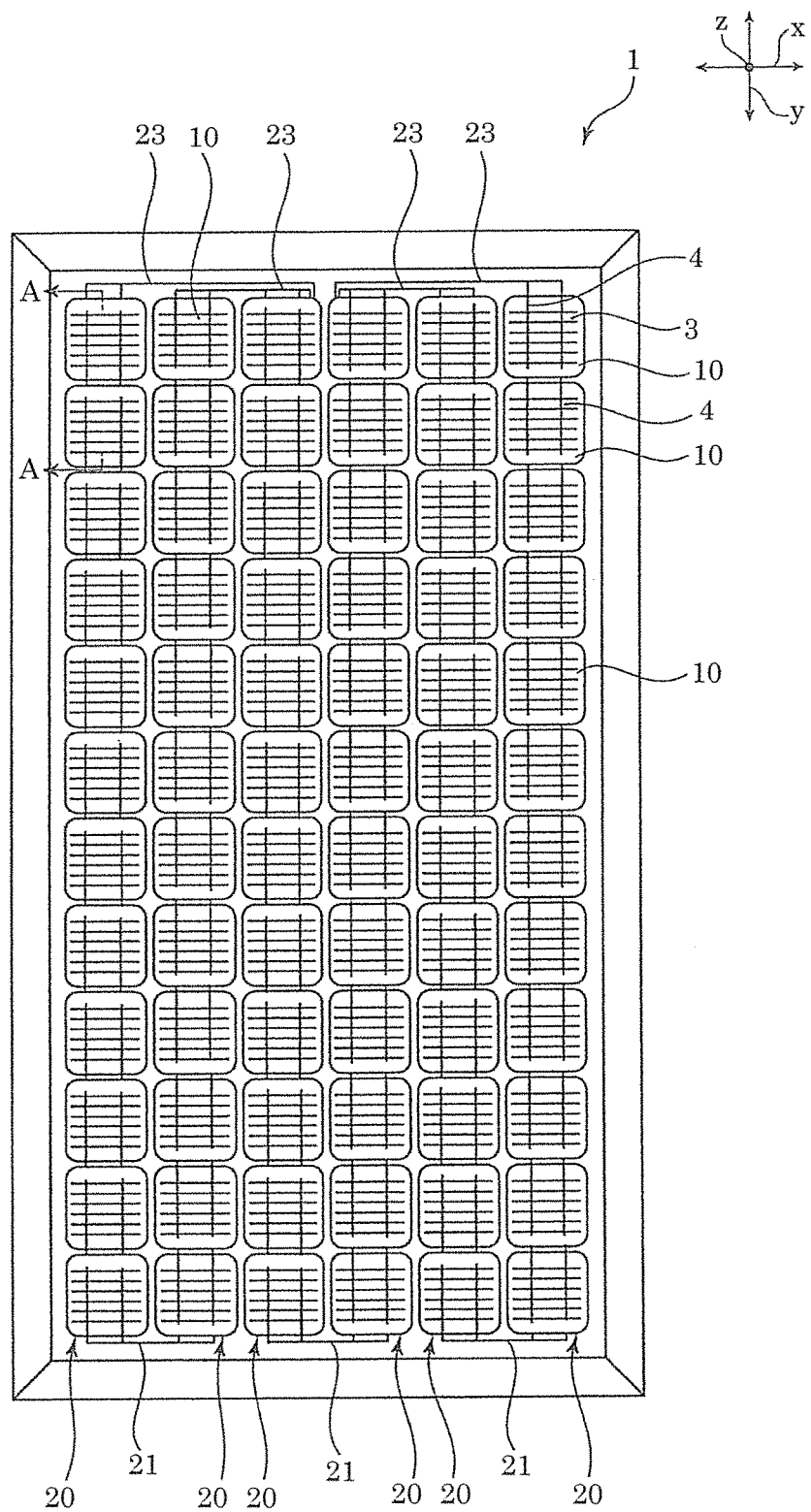
FIG. 1 is a schematic plain view illustrating an example of a solar cell module.

FIG. 1 is a schematic plain view illustrating an example of a solar cell module. As illustrated in FIG. 1, solar cell module 1 includes a plurality of solar cells 10. Each solar cell 10 is, for example, a solar cell including a crystalline silicon substrate, such as a monocrystalline silicon substrate and a polycrystalline silicon substrate. In the present embodiment, a solar cell is used in which a substantially intrinsic amorphous silicon layer is interposed between a monocrystalline silicon substrate and an amorphous silicon layer to reduce defects at the interfaces and improve the properties of hetero-junction interfaces.

Collector electrode 3 is formed on first main surface 11 (illustrated in FIG. 2) of solar cell 10. In the present embodiment, although not illustrated in the drawings, the collector electrode is formed also on second main surface 12 (illustrated in FIG. 2) opposite first main surface 11 of solar cell 10. Collector electrode 3 on first main surface 11 and the collector electrode on second main surface 12 may include finger electrodes and bus bar electrodes which cross the finger electrodes, or include only finger electrodes. Line members 4 are electrically connected on collector electrode 3 of first main surface 11 and on the collector electrode of second main surface 12.

Solar cells 10 arranged in the y-direction are electrically connected to neighboring solar cells 10 by line members 4. Solar cells 10 electrically connected by line members 4 constitute a single solar cell string 20. Solar cell strings 20 arranged in the x-direction are electrically connected by connecting lines 21 provided on one end side in the y-direction. On the other end side in the y-direction of solar cell strings 20, output lines 23 are connected to solar cell strings 20. Solar cell module 1 includes a plurality of solar cell strings 20 which are electrically connected by connecting lines 21 and output lines 23.

Embodiment 1

Figure 2:
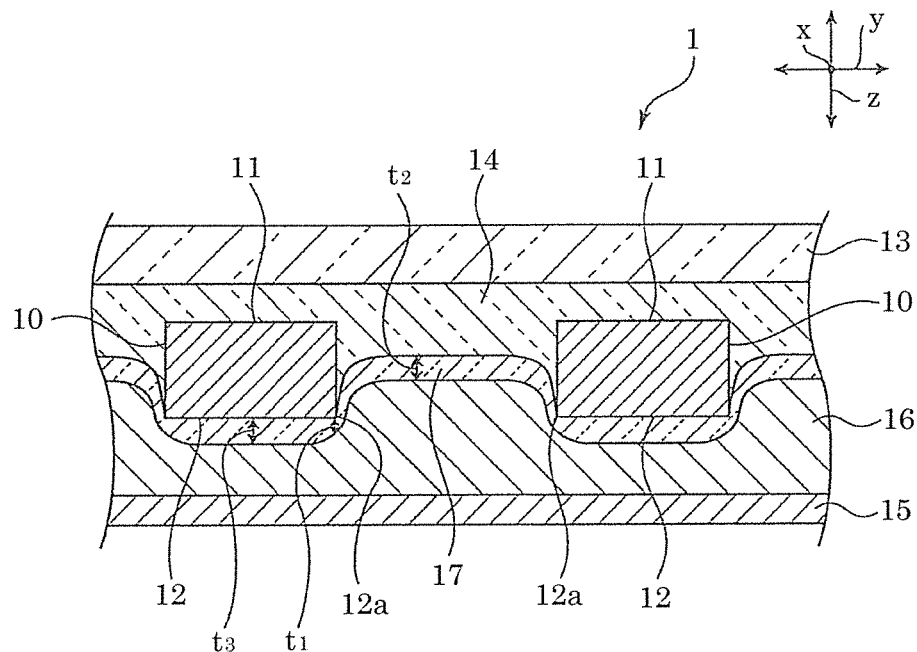
FIG. 2 is a schematic cross-sectional view taken along line A-A illustrated in FIG. 1 of a solar cell module according to Embodiment 1.

FIG. 2 is a schematic cross-sectional view taken along line A-A illustrated in FIG. 1 of a solar cell module according to Embodiment 1. As illustrated in FIG. 2, solar cell module 1 includes a plurality of solar cells 10, front-side transparent protective member 13, back-side protective member 15, front-side transparent encapsulant layer 14, back-side white encapsulant layer 16, and back-side transparent encapsulant layer 17. It should be noted that collector electrodes 3 and line members 4 are not illustrated in FIGS. 2 to 6.

Solar cells 10 each have first main surface 11 and second main surface 12. In the present embodiment, first main surface 11 is a light-receiving surface, and second main surface 12 is a back surface. As described above, solar cell 10 according to the present embodiment has a collector electrode formed on each of first main surface 11 and second main surface 12. Therefore, solar cell 10 according to the present embodiment is capable of receiving light also from second main surface 12 which is the back surface.

Front-side transparent protective member 13 is disposed on a first main surface 11-side of solar cells 10. Back-side protective member 15 is disposed on a second main surface 12-side of solar cells 10. Front-side transparent encapsulant layer 14 is disposed between front-side transparent protective member 13 and solar cells 10. Back-side white encapsulant layer 16 is disposed between back-side protective member 15 and solar cells 10. Back-side transparent encapsulant layer 17 is disposed between back-side white encapsulant layer 16 and solar cells 10.

Front-side transparent protective member 13 may be formed of a transparent substrate such as a glass plate, an acrylic plate, and a polycarbonate plate, and is formed of, for example, a glass plate. Back-side protective member 15 may be formed of a resin sheet or a resin film, for example. Back-side protective member 15 may include a plurality of layers, for example, a resin sheet or a resin film on which a metal layer, an inorganic oxide layer, etc. are laminated. Front-side transparent encapsulant layer 14 and back-side transparent encapsulant layer 17 may include a transparent resin, for example, a crosslinking resin such as an ethylene-vinyl acetate (EVA) copolymer, or a non-crosslinking resin such as a polyolefin. Back-side white encapsulant layer 16 may be formed by adding a white pigment such as titanium oxide to a resin, for example, a crosslinking resin such as an ethylene-vinyl acetate (EVA) copolymer, or a non-crosslinking resin such as a polyolefin.

By disposing back-side white encapsulant layer 16, light that has entered from front-side transparent protective member 13 and passed between solar cells 10 can be reflected off the surface of back-side white encapsulant layer 16 to cause the light to enter solar cells 10. Accordingly, disposing back-side white encapsulant layer 16 enables more efficient use of light.

Solar cells 10 are sealed by being interposed between front-side transparent encapsulant layer 14 and back-side transparent encapsulant layer 17. Solar cells 10 may be sealed by being interposed between front-side transparent encapsulant layer 14 and back-side white encapsulant layer 16 without disposing back-side transparent encapsulant layer 17. However, the adhesiveness between front-side transparent encapsulant layer 14 and back-side white encapsulant layer 16 becomes lower than the adhesiveness between front-side transparent encapsulant layer 14 and back-side transparent encapsulant layer 17. Thus, the sealing properties are reduced when solar cells 10 are interposed between front-side transparent encapsulant layer 14 and back-side white encapsulant layer 16 to seal solar cells 10. In the present embodiment, by disposing back-side transparent encapsulant layer 17, solar cells 10 are interposed between front-side transparent encapsulant layer 14 and back-side transparent encapsulant layer 17 to increase the sealing properties for solar cells 10.

As described above, the light that has passed between solar cells 10 is reflected off the surface of back-side white encapsulant layer 16. The reflected light enters solar cell 10 from first main surface 11 of solar cell 10, as well as from second main surface 12. Generally, photoelectric conversion efficiency when light is received by second main surface 12 which is the back surface is lower than the photoelectric conversion efficiency when light is received by first main surface 11 which is the light-receiving surface. Therefore, the output characteristics can be more improved by causing the reflected light to enter from the first main surface 11 than causing the reflected light to enter from second main surface 12.

In the present embodiment, thickness t1 of back-side transparent encapsulant layer 17 in the vicinity of edge portion 12a of second main surface 12 of solar cell 10 is less than thickness t2 of back-side transparent encapsulant layer 17 in a region between neighboring solar cells 10. Accordingly, the light that has been reflected off the surface of back-side white encapsulant layer 16 is less likely to pass through the portion of thickness t1. Therefore, according to the present embodiment, entering of the reflected light into second main surface 12 can be suppressed and more reflected light enters from first main surface 11. Therefore, the output characteristics can be further improved. It should be noted that "in the vicinity of" in the phrase "in the vicinity of edge portion 12a of second main surface 12" means that the position that is indicated by thickness t1 may be offset in the y-direction from edge portion 12a. For example, the position that is indicated by thickness t1 may be offset toward the solar cell 10 in the y-direction.

Moreover, in the present embodiment, back-side transparent encapsulant layer 17 is formed such that thickness t1 of back-side transparent encapsulant layer 17 in the vicinity of edge portion 12a of second main surface 12 of solar cell 10 is less than thickness t3 of back-side transparent encapsulant layer 17 in a region interposed between second main surface 12 of solar cell 10 and back-side white encapsulant layer 16. In other words, back-side transparent encapsulant layer 17 is formed such that thickness t1 of back-side transparent encapsulant layer 17 in the vicinity of edge portion 12a of second main surface 12 of solar cell 10 is less than a thickness of back-side transparent encapsulant layer 17 in a region excluding the vicinity of edge portion 12a. Therefore, the present embodiment is according to the first aspect and the second aspect.

It should be noted that each of thickness t2 and thickness t3 may be an average thickness of a corresponding region, or may be a thickness of a center portion in the corresponding region.

Embodiment 2

Figure 3:
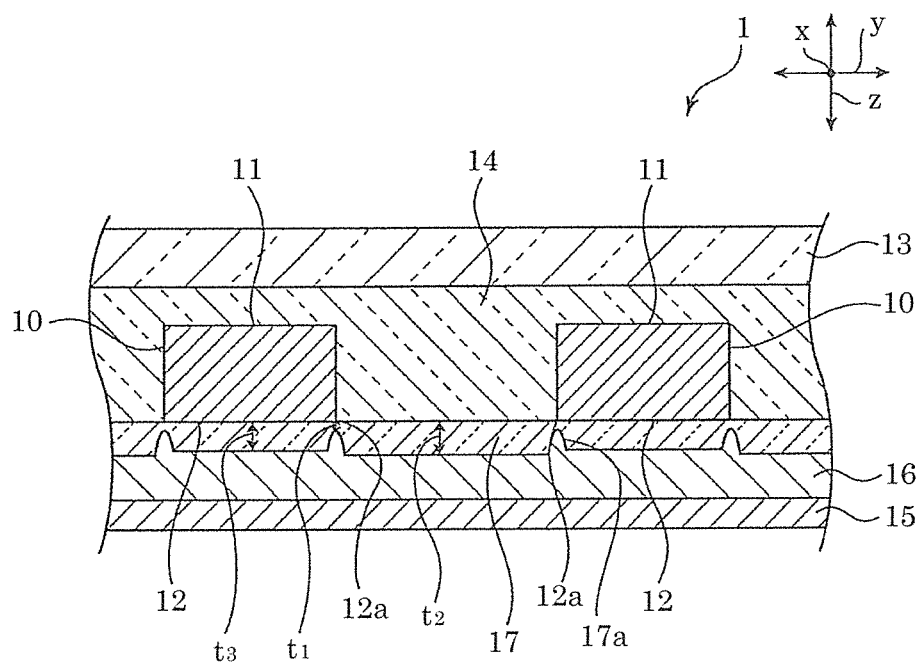
FIG. 3 is a schematic cross-sectional view taken along line A-A illustrated in FIG. 1 of a solar cell module according to Embodiment 2.

FIG. 3 is a schematic cross-sectional view taken along line A-A illustrated in FIG. 1 of a solar cell module according to Embodiment 2. In the present embodiment, back-side white encapsulant layer 16 has projection 17a formed below in the vicinity of edge portion 12a of second main surface 12 of solar cell 10. By forming projection 17a, thickness t1 becomes less than thickness t2 also in the present embodiment. In other words, thickness t1 of back-side transparent encapsulant layer 17 in the vicinity of edge portion 12a of second main surface 12 of solar cell 10 is less than thickness t2 of back-side transparent encapsulant layer 17 in a region between neighboring solar cells 10. Accordingly, as in Embodiment 1, entering of the reflected light into second main surface 12 can be suppressed and more reflected light enters from first main surface 11. Therefore, the output characteristics can be further improved.

It should be noted that, also in the present embodiment, back-side transparent encapsulant layer 17 is formed such that thickness t1 is less than thickness t3 of back-side transparent encapsulant layer 17 in a region interposed between second main surface 12 of solar cell 10 and back-side white encapsulant layer 16. Therefore, the present embodiment is according to the first aspect and the second aspect.

Embodiment 3

Figure 4:
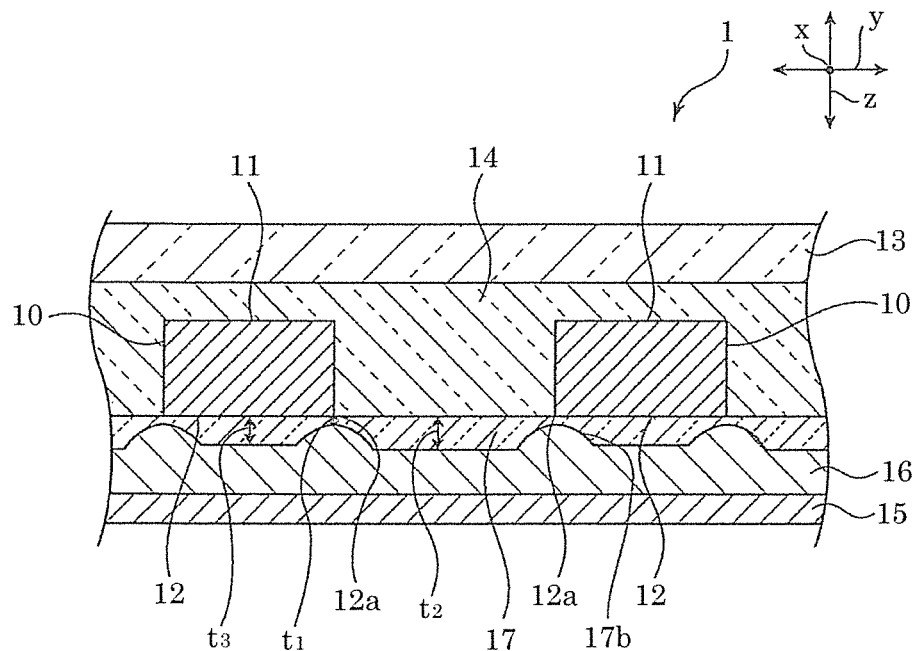
FIG. 4 is a schematic cross-sectional view taken along line A-A illustrated in FIG. 1 of a solar cell module according to Embodiment 3.

FIG. 4 is a schematic cross-sectional view taken along line A-A illustrated in FIG. 1 of a solar cell module according to Embodiment 3. In the present embodiment, back-side white encapsulant layer 16 has projection 17b having an arc-shaped cross section and formed below in the vicinity of edge portion 12a of second main surface 12 of solar cell 10. By forming projection 17b, thickness t1 becomes less than thickness t2 also in the present embodiment. In other words, thickness t1 of back-side transparent encapsulant layer 17 in the vicinity of edge portion 12a of second main surface 12 of solar cell 10 is less than thickness t2 of back-side transparent encapsulant layer 17 in a region between neighboring solar cells 10. Accordingly, as in Embodiment 1, entering of the reflected light into second main surface 12 can be suppressed and more reflected light enters from first main surface 11. Therefore, the output characteristics can be further improved.

It should be noted that, also in the present embodiment, back-side transparent encapsulant layer 17 is formed such that thickness t1 is less than thickness t3 of back-side transparent encapsulant layer 17 in a region interposed between second main surface 12 of solar cell 10 and back-side white encapsulant layer 16. Therefore, the present embodiment is according to the first aspect and the second aspect.

Embodiment 4

Figure 5:
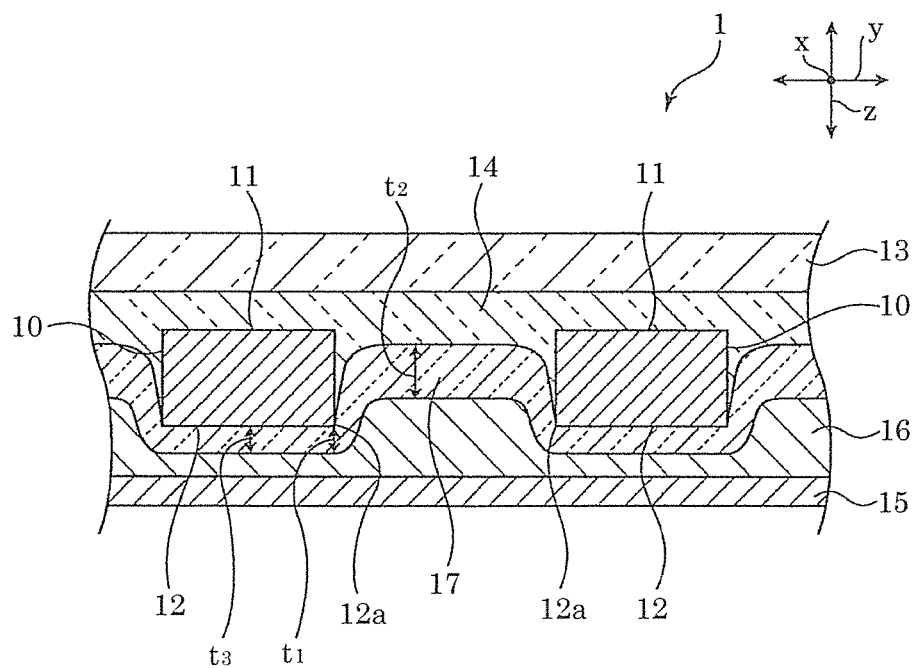
FIG. 5 is a schematic cross-sectional view taken along line A-A illustrated in FIG. 1 of a solar cell module according to Embodiment 4.

FIG. 5 is a schematic cross-sectional view taken along line A-A illustrated in FIG. 1 of a solar cell module according to Embodiment 4. In the present embodiment, back-side transparent encapsulant layer 17 is formed such that thickness t2 of back-side transparent encapsulant layer 17 in a region between neighboring solar cells 10 is greater than thickness t1 and thickness t3. Accordingly, thickness t1 is less than thickness t2. It should be noted that thickness t1 and thickness t3 are approximately the same thickness in the present embodiment. Therefore, the present embodiment is according to the first aspect.

Also in the present embodiment, entering of the reflected light into second main surface 12 can be suppressed and more reflected light enters from first main surface 11 as in Embodiment 1, since thickness t1 is less than thickness t2. Therefore, the output characteristics can be further improved. As described above, thickness t1 does not need to be less than thickness t3 as long as thickness t1 is less than thickness t2.

Embodiment 5

Figure 6:
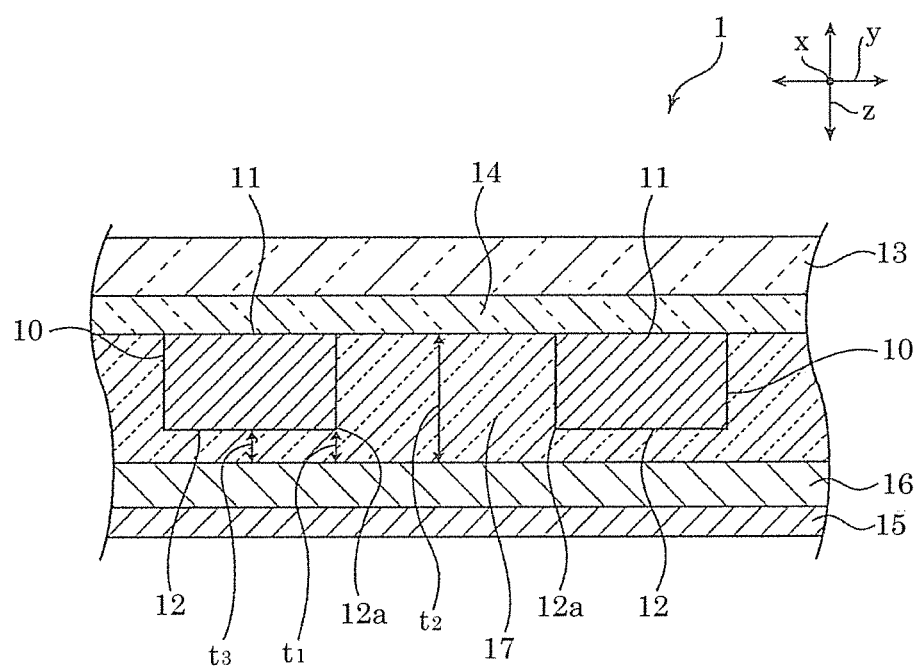
FIG. 6 is a schematic cross-sectional view taken along line A-A illustrated in FIG. 1 of a solar cell module according to Embodiment 5.

FIG. 6 is a schematic cross-sectional view taken along line A-A illustrated in FIG. 1 of a solar cell module according to Embodiment 5. In the present embodiment, back-side transparent encapsulant layer 17 is formed such that thickness t2 of back-side transparent encapsulant layer 17 in a region between neighboring solar cells 10 is greater than thickness t1 and thickness t3. Specifically, as illustrated in FIG. 6, solar cells 10 are embedded in back-side transparent encapsulant layer 17 such that the position of the upper surface of back-side transparent encapsulant layer 17 is approximately aligned with first main surfaces 11 of solar cells 10.

It should be noted that thickness t1 and thickness t3 are approximately the same thickness in the present embodiment. Therefore, the present embodiment is according to the first aspect.

Also in the present embodiment, entering of the reflected light into second main surface 12 can be suppressed and more reflected light enters from first main surface 11 as in Embodiment 1, since thickness t1 is less than thickness t2. Therefore, the output characteristics can be further improved.

Although each of the aforementioned embodiments describes between solar cells 10 that are neighboring in the y-direction with reference to FIGS. 2 to 6, the same applies between solar cells 10 that are neighboring in the x-direction. In other words, the present disclosure applies not only between solar cells 10 that are neighboring within a single solar cell string 20, but also between solar cells 10 that are neighboring between neighboring solar cell strings 20.

Although the foregoing has described the solar cell module according to the present disclosure based on the embodiments above, the present disclosure is not limited to the embodiments above. While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module comprising:
a plurality of solar cells each having a first main surface and a second main surface;
a front-side transparent protective member disposed on a first main surface- side of the plurality of solar cells;
a front-side transparent encapsulant layer disposed between the front-side transparent protective member and the plurality of solar cells;
a back-side protective member disposed on a second main surface-side of the plurality of solar cells;
a back-side white encapsulant layer disposed between the back-side protective member and the plurality of solar cells; and
a back-side transparent encapsulant layer disposed between the back-side white encapsulant layer and the plurality of solar cells,
wherein a thickness of the back-side transparent encapsulant layer in a vicinity of an edge portion of the second main surface of the plurality of solar cells is less than a thickness of the back-side transparent encapsulant layer in a region between the plurality of solar cells that are neighboring to each other.

2. A solar cell module comprising:
a plurality of solar cells each having a first main surface and a second main surface;
a front-side transparent protective member disposed on a first main surface-side of the plurality of solar cells;
a front-side transparent encapsulant layer disposed between the front-side transparent protective member and the plurality of solar cells;
a back-side protective member disposed on a second main surface-side of the plurality of solar cells;
a back-side white encapsulant layer disposed between the back-side protective member and the plurality of solar cells; and
a back-side transparent encapsulant layer disposed between the back-side white encapsulant layer and the plurality of solar cells,
wherein a thickness of the back-side transparent encapsulant layer in a vicinity of an edge portion of the second main surface of the plurality of solar cells is less than a thickness of the back-side transparent encapsulant layer in a region interposed between the second main surface of the plurality of solar cells and the back-side white encapsulant layer.

* * * * *